United States Patent [19]
Beneking et al.

[11] Patent Number: 5,853,498
[45] Date of Patent: Dec. 29, 1998

[54] THIN FILM SOLAR CELL

[75] Inventors: Claus Beneking; Marcus Kubon; Magnus Kolter, all of Aachen, Germany

[73] Assignee: Forschungszentrum Julich GmbH, Julich, Germany

[21] Appl. No.: 718,587

[22] PCT Filed: Mar. 17, 1995

[86] PCT No.: PCT/DE95/00379

§ 371 Date: Nov. 25, 1996

§ 102(e) Date: Nov. 25, 1996

[87] PCT Pub. No.: WO95/26050

PCT Pub. Date: Sep. 28, 1995

[30] Foreign Application Priority Data

Mar. 24, 1994 [DE] Germany .......................... 44 10 220.8

[51] Int. Cl.⁶ .................................................. H01L 31/075
[52] U.S. Cl. ............................................................ 136/258
[58] Field of Search ...................... 136/258 AM

[56] References Cited

U.S. PATENT DOCUMENTS 4,776,894 10/1988 Watanabe et al. ............... 136/258 AM

OTHER PUBLICATIONS

"High–efficiency double junction solar cells . . " by Yoshida et al., 10th EC Photovoltaic Solar Energy Conference, 8 Apr. 1993, pp. 1193, 1196.

"High mobility hydrogenated and oxygenated monocrystalline silicon . . . " by Faraji et al., Applied Physics Letter, vol. 60, No. 26, 29 Jun. 1992, pp. 3289–3291.

"An optimum design of a–Si/poly–Si tandem solar cell" 23rd IEEE Photovoltaic Conference, 10 May 1993, pp. 833–838.

"Transparent conducting electrons on silicon", by Kurtz et al, Solar Energy Materials, vol. 15, No. 4, May 1987, pp. 229–236.

"Modification of TCO–p interface in a–Si:H solar cells . . . " by Kubon et al., 12 European Photovoltaic Solar Energy Conference, 11 Apr. 1994, pp. 1268–1271.

*Primary Examiner*—Mark Chapman
*Attorney, Agent, or Firm*—Herbert Dubno

[57] ABSTRACT

A thin-film solar cell in which between a TCO layer and a p-doped layer an n-doped intermediate layer is provided and at least the intermediate layer or the neighboring p-doped layer is composed of a microcrystalline material, especially microcrystalline SiC or SiO.

5 Claims, 1 Drawing Sheet

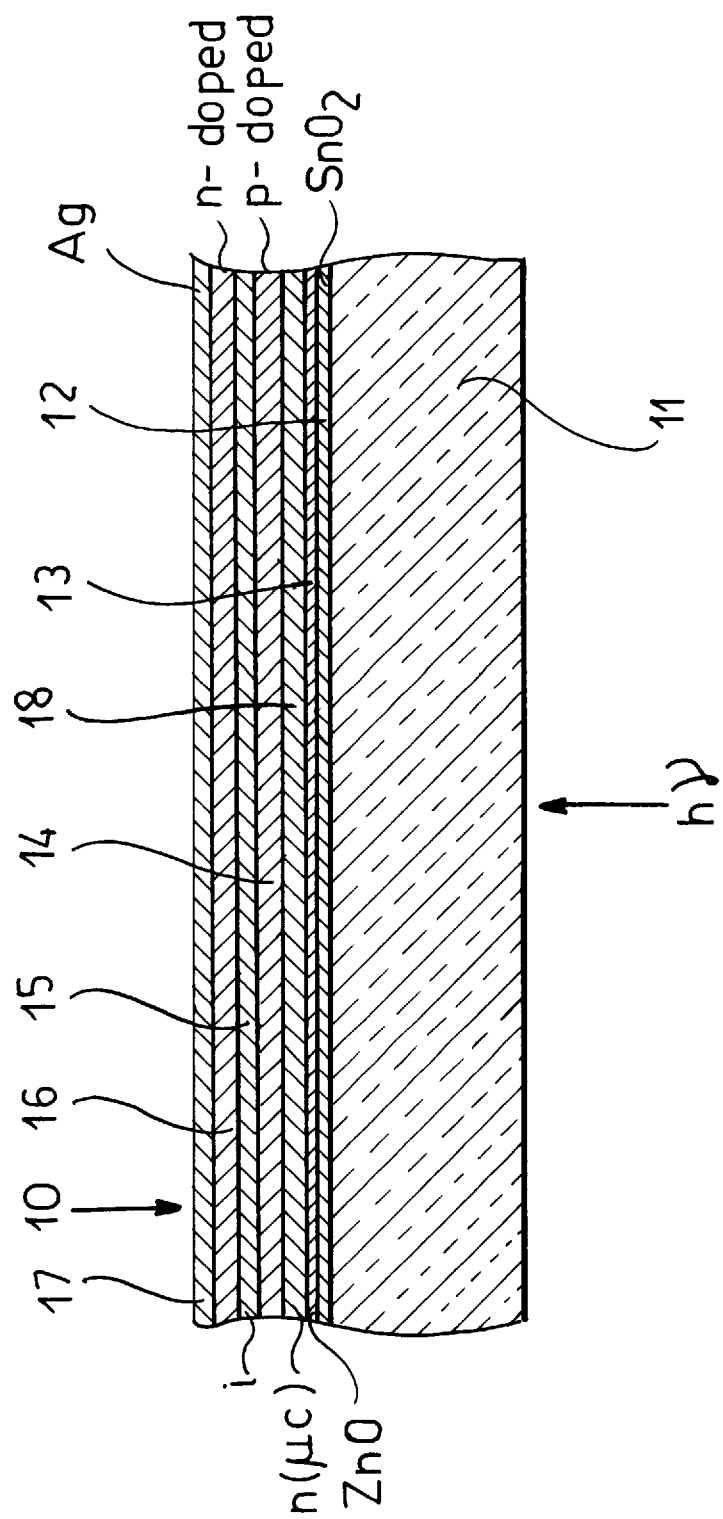

THIN FILM SOLAR CELL

CROSS REFERENCE TO RELATED APPLICATIONS

This application is a national phase of PCT/DE 95/00379 filed 17 Mar. 1995 and based, in turn, upon German application P 44 10220.8 of 24 Mar. 1994 under the International Convention.

FIELD OF THE INVENTION

The invention relates to a thin film solar cell based/ amorphous hydrogenated silicon and/or its alloys and, more particularly, with at least one layer sequence of p-doped, undoped(i) and n-doped layers, especially a metallic layer bonded to the last n-doped layer.

BACKGROUND OF THE INVENTION

Thin film solar cells of amorphous hydrogenated silicon (a-Si:H) and/or its alloys are produced with a doping sequence n-i-p or p-i-n or in known variants (e.g. with additionally incorporated buffer layers) by layer deposition upon suitable opaque or transparent substrates. Such a solar cell thus can also be provided in the form of a stacked solar cell in a cascade arrangement (so-called stacked cell e.g. p-i-n-p-i-n).

In the case in which the light impingement is from the p-doped side because of different mobilities of the charge carriers n and p, an improvement in the efficiency y of the solar cell is attained.

To improve the light entry in the undoped (i)-layer dimensioned for the light conversion and also for electrical improvement, the band gap of the p-doped layer is advantageously selected to be higher than that of the i-layer. This can be realized for example by alloying the a-Si:H with N, C or O.

As a rule the contact layers at the light inlet side are transparent conductive oxide layers, so-called (TCO) layers, for example ITO, $SnO_2$, ZnO, $TiO_2$. At the side turned away from the light, a TCO layer can also be provided or a metal layer or a combination of the two can be chosen.

It is known that the TCO-p contact can make up a significant fraction of the total series resistance of an a-Si:H solar cell so that the so-called fill factor (FF) is disadvantageously reduced and the efficiency y of the solar cell is reduced.

In T. Yoshida et al., Proceedings 10th European PV Solar Energy Conference, Lisbon 1991, page 1193, to reduce the TCO-p contact resistance, the insertion of an SiOx "recombination layer" between the ZnO and p is proposed for the contact system ZnO-p. Quantitative results for the there-described conclusion of an improvement were not given.

OBJECT OF THE INVENTION

It is the object of the invention to provide a solar cell which, by contract with the known solar cells, especially for ZnO or $TiO_2$ as TCO which will have a reduced TCO-p contact resistance which is desirable for a satisfactory efficiency y of the solar cell and an increased so-called fill factor FF (or an increased open circuit voltage $V_{oc}$) associated therewith.

SUMMARY OF THE INVENTION

This object is achieved in a thin-film solar system with at least one layer sequence of p-doped, undoped(i) and n-doped layers, a TCO-layer neighboring the first p-doped layer and a contact layer, especially a metallic layer bonded to the last n-doped layer, wherein between the TCO layer and the p-doped neighboring same a small n-doped intermediate layer is provided and at least the intermediate layer or its neighboring p-doped layer is microcrystalline.

The insertion of an n-doped intermediate layer between the TCO and p-doped layer and the microcrystalline ($\mu c$) configuration of the intermediate layer leads to an improved FF and increased no-load voltage $V_{oc}$ at the TCO, especially ZnO. It is advantageous, alternatively or cumulatively, to provide the p-doped layer as microcrystalline(uc).

For reducing or avoiding absorption losses, we may use as the material for the incorporated n-doped intermediate layer a material with increased band gap (for example $\mu c$-SiC or $\mu c$-SiO).

An especially advantageous embodiment of the solar cell of the invention is obtained is given when the layer thicknesses of the n- and p-layers are so selected that the total layer thickness of these two layers does not exceed the layer thickness of an optimum p-layer on the same (TCO—) substrate.

In this case, the light loss is equal to or less than that of a TCO-p contact without an introduced n-layer. As a result not only is the fill factor and the open circuit voltage $V_{oc}$ increased, but also the efficiency y of the solar cell as a whole is improved.

In an especially advantageous embodiment the material for the TCO layer comprises ZnO or $TiO_2$. The use of ZnO or $TiO_2$ as TCO substrate or contact layer on the light-entry side has the following advantages:

a) ZnO or $TiO_2$ allow a higher light coupling by contrast to $SnO_2$ because in the visible range of the spectrum they are more transparent; and b) ZnO or $TiO_2$ have better chemical stability against reduction by the hydrogen-containing low pressure silane plasma usually utilized for the deposition of the a-Si:H.

BRIEF DESCRIPTION OF THE DRAWING

The above and other objects, features, and advantages of the present invention will become more readily apparent from the following specific description and Examples given with reference to the accompanying drawing, the sole FIGURE of which is a cross section through a solar cell according to the invention of the type described with respect to the solar cell (m) or (o), for example, of the following Table and Examples.

SPECIFIC DESCRIPTION

The solar cell 10 shown in the drawing comprises a glass substrate 11 upon which light is incident and which is provided with a succession of layers or coatings as described below and including, for example, a first coating 12 of $SnO_2$, a layer of ZnO 13 on the coating 12 and a microcrystalline n-doped layer 18 on the layer 13. This n-doped microcrystalline layer is followed by a p-doped layer 14, an intrinsic (i) layer 15 and an n-doped layer 16. The latter is followed by a metallic layer 17 of Ag. The solar cell shown in the drawing corresponds, as has been noted, to the solar cells (m) and (o) described below with reference to the table.

EXAMPLES

Below in Table 1 examples of prepared test solar cells based on a-Si:H have been given.

For each solar cell, there is given

The measured open circuit voltage $V_{oc}$ in millivolts, the so-called short circuit current density $j_{sc}$ in milliamperes per $cm^2$, the fill factor FF in percent, as well as the efficiency y in %.

TABLE 1

| | $V_{oc}$ (mV) | $j_{sc}$ mA/ $cm^2$ | FF (%) | y (%) |
|---|---|---|---|---|
| a) Glass-$SnO_2$-p-i-n-Ag | 821 | 13.24 | 71.6 | 7.77 |
| b) Glass-$SnO_2$—ZnO-p-i-n-Ag (10 nm undoped ZnO) | 798 | 13.45 | 68.3 | 7.33 |
| c) Glass-$SnO_2$—ZnO-p-i-n-Ag (10 nm Aluminum-doped ZnO) | 804 | 13.48 | 68.2 | 7.4 |
| d) as in a) | 829 | 13.5 | 71.2 | 7.95 |
| e) Glass-$SnO_2$—ZnO-p-i-n-Ag (10 nm boron-doped ZnO) | 755 | 13.65 | 55 | 5.5 |
| f) Glass-$SnO_2$—SiOx(p)-p-i-n-Ag | 827 | 12.8 | 70.7 | 7.49 |
| g) Glass-$SnO_2$—ZnO—SiOx(p)-p-i-n-Ag (10 nm aluminum-doped ZnO) | 820 | 13.05 | 65.8 | 7.05 |
| h) as in a) | 840 | 14.0 | 69.2 | 7.8 |
| i) Glass-ZnO:B-p-i-n-Ag (without $SnO_2$!) | 780 | 15.6 | 66.1 | 8.1 |
| j) Glass-$SnO_2$-n($\mu$c)-p-i-n-Ag (15 nm n($\mu$c)) | 804 | 10.28 | 72.1 | 5.96 |
| k) Glass-$SnO_2$—ZnO-n($\mu$c)-p-i-n-Ag (10 nm aluminum-doped ZnO) (15 nm n($\mu$c)) | 802 | 10.47 | 71.4 | 5.99 |
| l) Glass-$SnO_2$-n($\mu$c)-p-i-n-Ag (10 nm n($\mu$c)) | 807 | 12.25 | 72.3 | 7.15 |
| m) Glass-$SnO_2$—ZnO-n($\mu$c)-p-i-n-Ag (10 nm aluminum-doped ZnO) (10 nm n($\mu$c)) | 815 | 12.57 | 71.8 | 7.35 |
| n) Glass-$SnO_2$-n($\mu$c)-p-i-n-Ag (10 nm n($\mu$c)) | 817 | 11.65 | 71.1 | 6.76 |
| o) Glass-$SnO_2$—ZnO-n($\mu$c)-p-i-n-Ag (10 nm boron-doped ZnO) (10 nm n($\mu$c)) | 819 | 12.4 | 71.1 | 7.21 |

The tests show:

the FF drop and $V_{oc}$ drop in the change from $SnO_2$ substrates to $SnO_2$-ZnO substrates (a) compared with b) or c); D) with e) for boron-doped ZnO), the FF drop and the $V_{oc}$ drop also for the case in which the TCO-layer is comprised entirely of ZnO (h) by comparison with i), that the introduction of a p-doped or undoped SiOx-layer between TCO and p does not solve the problem (f), g), both in the case of an undoped SiOx intervening layer and also with a p-doped SiOx intervening layer, the configuration in "g" is poorer), the clear improvement of the FF and $V_{oc}$, especially for glass-$SnO_2$-ZnO substrate by insertion of a microcrystalline ($\mu$c) n-layer between TCO and p-layer (k), in comparison with b), c), e), f), I), the further improvement where the thickness of the ($\mu$c) n-layer is reduced ( 1), m)) and the fact that the improvement is also achieved with doped ZnO (o)).

What is claimed is:

1. A thin-film solar cell with at least one layer sequence of p-doped, undoped and n-doped layers, a TCO-layer neighboring the first p-doped layer and a metallic contact layer bonded to the last n-doped layer between the TCO layer and the first p-doped layer an n-doped intermediate layer is provided in direct contact with the TCO layer and the first p-doped layer and at least the intermediate layer or its neighboring p-doped layer is microcrystalline.

2. Solar cells according to claim 1 characterized in that as the material for the n-doped intermediate layer, especially microcrystalline Sic or SiO is provided.

3. Solar cells according to claim 1 or 2 characterized in that the sum of the layer thicknesses of the intermediate layer bonded to the TCO layer and the p-doped layer bonded thereto, does not exceed the layer thickness of an optimum p-layer on same TCO layer without intervening layers.

4. Solar cell according to one of claims 1, 2 or 3 characterized in that as the material for the TCO layer ZnO or $TiO_2$ is provided.

5. Solar cell according to one of claims 1–4 characterized in that the TCO layer is formed as a substrate upon which the stack sequence formed by the solar cell forming layers is applied.

* * * * *